(12) United States Patent
Miura

(10) Patent No.: US 12,356,811 B2
(45) Date of Patent: Jul. 8, 2025

(54) DISPLAY DEVICE AND ELECTRONIC DEVICE WITH HEAT ABSORPTION LAYER COUPLED TO PAD ELECTRODE LAYER

(71) Applicant: Sony Semiconductor Solutions Corporation, Kanagawa (JP)

(72) Inventor: Kiwamu Miura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 756 days.

(21) Appl. No.: 17/428,413

(22) PCT Filed: Mar. 4, 2020

(86) PCT No.: PCT/JP2020/009132
§ 371 (c)(1),
(2) Date: Aug. 4, 2021

(87) PCT Pub. No.: WO2020/184329
PCT Pub. Date: Sep. 17, 2020

(65) Prior Publication Data
US 2022/0130914 A1    Apr. 28, 2022

(30) Foreign Application Priority Data
Mar. 12, 2019   (JP) .................................. 2019-044656

(51) Int. Cl.
*H10K 59/131* (2023.01)
*H10K 50/87* (2023.01)
(Continued)

(52) U.S. Cl.
CPC ........... *H10K 59/131* (2023.02); *H10K 50/87* (2023.02); *H10K 59/121* (2023.02); *H10K 59/8794* (2023.02)

(58) Field of Classification Search
CPC .... H10K 59/121; H10K 59/131; H10K 50/87; H10K 59/8794
See application file for complete search history.

(56) References Cited

U.S. PATENT DOCUMENTS 10,854,530 B1 * 12/2020 Cheng ..................... H01L 25/18
2005/0162577 A1 * 7/2005 Yoon ....................... H01L 24/83
257/E21.511
(Continued)

FOREIGN PATENT DOCUMENTS

CN   103268885 A   8/2013
CN   109411376 A   3/2019
(Continued)

OTHER PUBLICATIONS

International Search Report (PCT/ISA/210), International Application No. PCT/JP2020/009132, dated May 19, 2020.
(Continued)

*Primary Examiner* — Lex H Malsawma
(74) *Attorney, Agent, or Firm* — Michael Best & Friedrich LLP

(57) ABSTRACT

Display devices and electronic devices are disclosed. In one example, a display device includes a pixel array portion in which pixels each including a light emitting portion are arranged; a pad electrode layer provided outside the pixel array portion on a substrate on which a light emitting portion is formed; and a heat absorption layer thermally coupled to the pad electrode layer.

4 Claims, 10 Drawing Sheets

(51) Int. Cl.
  *H10K 59/121* (2023.01)
  *H10K 59/80* (2023.01)

(56) References Cited

U.S. PATENT DOCUMENTS

| | | | |
|---|---|---|---|
| 2006/0267470 A1 | 11/2006 | Lee | |
| 2008/0079889 A1 | 4/2008 | Lee et al. | |
| 2014/0166994 A1 | 6/2014 | Xiong et al. | |
| 2015/0206929 A1* | 7/2015 | Sato | H10K 50/11 257/40 |
| 2017/0104019 A1* | 4/2017 | Jung | H10F 39/805 |
| 2018/0337226 A1* | 11/2018 | Liu | H10K 50/81 |

FOREIGN PATENT DOCUMENTS

| | | |
|---|---|---|
| JP | 2003086362 A | 3/2003 |
| JP | 2005-159212 A | 6/2005 |
| JP | 2006-228456 A | 8/2006 |
| JP | 2010-212108 A | 9/2010 |
| JP | 2012-209018 A | 10/2012 |
| JP | 2014241262 A | 12/2014 |
| JP | 2015002125 A | 1/2015 |
| JP | 2016-046215 A | 4/2016 |
| JP | 2019-186031 A | 10/2019 |
| WO | 2013/114495 A1 | 8/2013 |
| WO | 2013/168619 A1 | 11/2013 |
| WO | 2018/047492 A1 | 3/2018 |

OTHER PUBLICATIONS

Notification of Transmittal of the International Search Report and the Written Opinion of the International Searching Authority, or the Declaration (PCT/ISA/220), International Application No. PCT/JP2020/009132, dated Jun. 2, 2020.

Written Opinion of the International Search Authority (PCT/ISA/237), International Application No. PCT/JP2020/009132, dated Jun. 2, 2020.

\* cited by examiner

DISPLAY DEVICE AND ELECTRONIC DEVICE WITH HEAT ABSORPTION LAYER COUPLED TO PAD ELECTRODE LAYER

TECHNICAL FIELD

The present disclosure relates to a display device and an electronic device.

BACKGROUND ART

In recent years, flat (flat panel) display devices are the mainstream of display devices. As one of the flat display devices, there is a display device including, as a light emitting portion (light emitting element) of a pixel, a so-called current-driven electro-optical device having light emission brightness that changes in accordance with the value of the current flowing through the device. Examples of a current-driven electro-optical device may include an organic electroluminescence (hereinafter, may be referred to as "EL") device that uses electro luminescence of an organic material and that emits light when an electric field is applied to an organic thin film (see, for example, Patent Document 1).

CITATION LIST

Patent Document

Patent Document 1: Japanese Patent Application Laid-Open No. 2012-209018

SUMMARY OF THE INVENTION

Problems to be Solved by the Invention

By the way, organic EL devices are weak in heat resistance. Therefore, it is necessary to pay sufficient attention to heat in the manufacturing process of an organic EL display device. In particular, in a microdisplay having a semiconductor substrate as a substrate forming an organic EL device and its driving circuit portion, the panel size is small, so that especially in a mounting process that requires a high temperature after the EL process, heat applied to the pad portion propagates to the organic EL device in the display area (pixel area), and deterioration of the organic EL device due to the heat damage may deteriorate the display quality.

Therefore, an object of the present disclosure is to provide a display device capable of reducing heat damage to a light emitting portion of an organic EL device or the like and suppressing deterioration of display quality due to the heat damage, and an electronic device including the display device.

Solutions to Problems

A display device of the present disclosure for achieving the above-described object includes:
- a pixel array portion in which pixels each including a light emitting portion are arranged;
- a pad electrode layer provided outside the pixel array portion on a substrate on which a light emitting portion is formed; and
- a heat absorption layer thermally coupled to the pad electrode layer.

Furthermore, an electronic device of the present disclosure for achieving the above-described object includes a display device having the above-described configuration.

MODE FOR CARRYING OUT THE INVENTION

Figure 1:
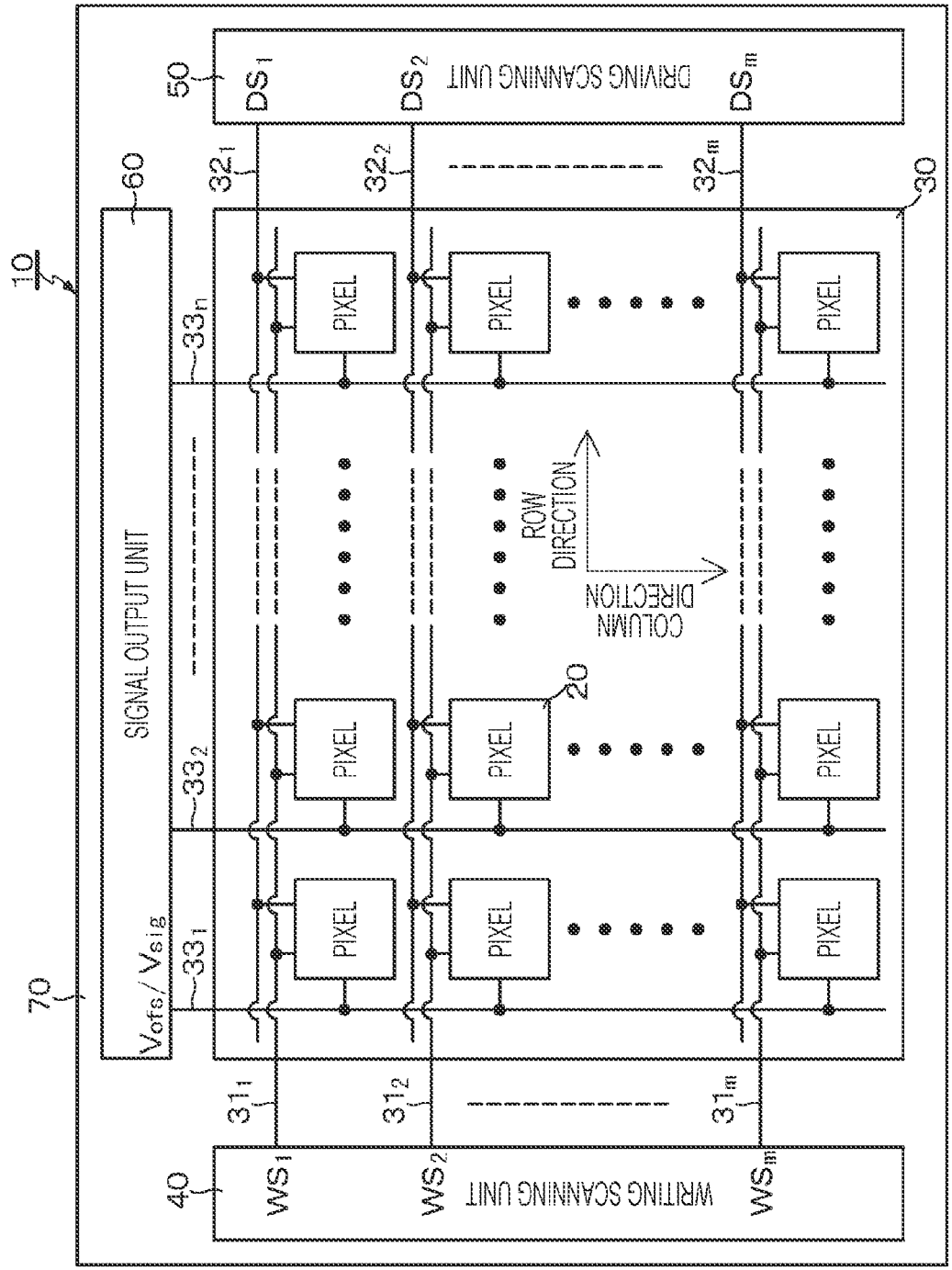
FIG. 1 is a system configuration diagram illustrating an outline of a basic configuration of a display device to which the technology of the present disclosure is applied.

Hereinafter, embodiments for carrying out the technology of the present disclosure (hereinafter, referred to as "embodiments") will be described in detail with reference to the drawings. The technology of the present disclosure is not limited to the embodiments, and various numerical values and materials in the embodiments are examples. In the following description, the same reference symbols are used for the same element or elements having the same function, and the description is not repeated. Note that the description will be given in the following order.

1. Overall description of display device and electronic device of present disclosure
2. Active matrix display device to which technology of present disclosure is applied
    2-1. System configuration
    2-2. Pixel circuit
    2-3. Basic panel structure
3. Embodiments of present disclosure
    3-1. First example (an example, in which a heat absorption layer is provided corresponding to a part, in the length direction, of each pad of a pad electrode layer)
    3-2. Second example (is an example in which the heat absorption layer is provided over the whole, in the length direction, of each pad of the pad electrode layer)

4. Modification Examples
5. Electronic device of present disclosure
   5-1. First specific example (example of smartphone)
   5-2. Second specific example (example of head mounted display]
   5-3 Third specific example (example of digital still camera)
6. Possible configuration of present disclosure <Overall Description of Display Device and Electronic Device of Present Disclosure>

In a display device and an electronic device of the present disclosure, a heat absorption layer may have a function of increasing the heat capacity of a pad electrode layer. Furthermore, the heat absorption layer may include a wiring layer formed as a layer below the pad electrode layer.

In the display device and the electronic device of the present disclosure having the above-described preferable configuration, the heat absorption layer may be provided over the whole, in the length direction, of each pad of the pad electrode layer. Furthermore, a circuit wiring layer may be provided below the heat absorption layer. Furthermore, a wiring layer formed as the same layer as the heat absorption layer may be provided below the pixel array portion.

Furthermore, in the display device and the electronic device of the present disclosure having the above-described preferable configuration, the light emitting portion may include an organic electroluminescence device (organic EL device). The heat absorption layer may be made from the same material as the material of the anode electrode of the organic electroluminescence device.

Furthermore, in the display device and the electronic device of the present disclosure having the above-described preferable configuration, the circuit portion that drives the light emitting portion may be formed on a semiconductor substrate.

In the display device and the electronic device of the present disclosure having the above-described preferable configuration, the display device may have a configuration of an organic EL display device in which a plurality of sub-pixels includes light emitting portions (light emitting elements) made from organic EL devices. That is, in the organic EL display device, sub-pixels are formed by respective organic EL devices. The organic EL device is a so-called current-driven electro-optical device having light emission brightness that changes in accordance with the value of the current flowing through the device.

The organic EL display device can be used as a monitor device included in a personal computer, a video camera, or a digital still camera, for example, a television receiver, a mobile phone, a personal digital assistant (PDA), or a game device. Alternatively, the organic EL display device can be applied to an electronic view finder (EVF) and a head mounted display (HMD). Alternatively, other lighting devices including a backlight device and a planar light source device for a liquid crystal display device can be exemplified.

In the organic EL device, the organic layer, which is a light-emitting functional layer, includes a light emitting layer (for example, a light emitting layer made from an organic light emitting material). Specifically, the organic layer may have a laminated structure such as a laminated structure of a hole transport layer, a light emitting layer, and an electron transport layer, a laminated structure of a hole transport layer, and a light emitting layer that also serves as an electron transport layer, and a laminated structure of a hole injection layer, a hole transport layer, a light emitting layer, an electron transport layer, and an electron injection layer, for example. Furthermore, in a case where these laminated structures and the like are provided as tandem units, the organic layer may have a two-stage tandem structure in which a first tandem unit, a connecting layer, and a second tandem unit are laminated, and the organic layer may also have a three-stage tandem structure in which three or more tandem units are laminated. In these cases, by making tandem units have different light-emission colors such as red, green, and blue, an organic layer that emits white light as a whole can be obtained.

Examples of a method for forming an organic layer include a physical vapor deposition method (PVD method) such as a vacuum vapor deposition method; a printing method such as a screen printing method or an inkjet printing method; a laser transfer method for irradiating a laminated structure of a laser absorbing layer and an organic layer formed on a transfer substrate with laser light to separate the organic layer on the laser absorbing layer and transfer the organic layer, and various coating methods. In a case where an organic layer is formed on the basis of a vacuum vapor deposition method, for example, an organic layer can be obtained by using a so-called metal mask and depositing a material that has passed through an opening formed in the metal mask, and the organic layer can be formed on the entire surface without patterning.

<Display Device to which the Technology of Present Disclosure is Applied>

The display device of the present disclosure is an active matrix display device in which the current flowing through the electro-optical device is controlled by an active element provided in the same pixel circuit as the electro-optical device, for example, an insulated gate field effect transistor. Typical examples of an insulated gate field effect transistor include a metal oxide semiconductor (MOS) transistor and a thin film transistor (TFT).

Here, the display device of the present disclosure will be described by taking as an example an active matrix organic EL display device including an organic EL device, which is an example of a current-driven electro-optical device, as a light emitting portion (light emitting element) of a pixel circuit. In the following, the "pixel circuit" may be simply referred to as a "pixel".

[System Configuration]

FIG. 1 is a system configuration diagram illustrating an outline of a basic configuration of an active matrix organic EL display device, which is a display device to which the technology of the present disclosure is applied.

As illustrated in FIG. 1, an active matrix organic EL display device 10 to which the technology of the present disclosure is applied includes a pixel array portion 30 formed by arranging a plurality of pixels 20 each including an organic EL device two-dimensionally in a matrix form, and a peripheral circuit (peripheral drive unit) arranged in the peripheral area of the pixel array portion 30.

The peripheral circuit of the pixel area includes, for example, a writing scanning unit 40, a driving scanning unit 50, a signal output unit 60, and the like mounted on a display panel 70 that is the same display panel, on which the pixel array portion 30 is mounted, and the peripheral circuit drives each pixel 20 of the pixel array portion 30. Note that the peripheral circuit may also have a configuration, in which some or all of the writing scanning unit 40, the driving scanning unit 50, and the signal output unit 60 are provided outside the display panel 70.

The organic EL display device 10 may support monochrome (black and white) display or may support color display. In a case where the organic EL display device 10 supports color display, one pixel (unit pixel/pixel) as a unit for forming a color image includes a plurality of sub-pixels (sub-pixels). At this time, each of the sub-pixels corresponds to the pixel 20 in FIG. 1. More specifically, in a display device that supports color display, one pixel includes three sub-pixels that are, for example, a sub-pixel that emits red (R) light, a sub-pixel that emits green (G) light, and a sub-pixel that emits blue (B) light.

However, one pixel is not limited to the combination of the sub-pixels of the three primary colors of R, G, and B, and one pixel may include the sub-pixels of the three primary colors and pixels of one or more additional colors. More specifically, for example, one pixel may additionally include a sub-pixel that emits white (W) light to improve brightness, or one pixel may include at least one sub-pixel that emits complementary color light to expand the color reproduction range.

In the pixel array portion 30, to the array of pixels 20 of m rows and n columns, scanning lines 31 ($31_1$ to $31_m$) and drive lines 32 ($32_1$ to $32_m$) are wired along a first direction (row direction/horizontal direction) for the respective pixel rows. Moreover, for the array of pixels 20 of m rows and n columns, signal lines 33 ($33_1$ to $33_n$) are wired along a second direction (column direction/vertical direction) for the respective pixel columns.

The scanning lines $31_1$ to $31_m$ are connected to the output terminals of the corresponding rows of the writing scanning unit 40. The drive lines $32_1$ to $32_m$ are connected to the output terminals of the corresponding rows of the driving scanning unit 50. The signal lines $33_1$ to $33_n$ are connected to the output terminals of the corresponding columns of the signal output unit 60.

The writing scanning unit 40 includes a shift register circuit or the like. When writing the signal voltage of the video signal to each pixel 20 of the pixel array portion 30, the writing scanning unit 40 sequentially supplies writing scanning signals WS ($WS_1$ to $WS_m$) to the scanning lines 31 ($31_1$ to $31_m$) to scan each of the pixels 20 of the pixel array portion 30 in units of rows, that is, performs so-called line-sequential scanning.

Similarly to the writing scanning unit 40, the driving scanning unit 50 includes a shift register circuit or the like. The driving scanning unit 50 controls light emission and non-light emission (quenching) of the pixels 20 by supplying the light emission control signal DS ($DS_1$ to $DS_m$) to the drive lines 32 ($32_1$ to $32_m$) in synchronization with the line-sequential scanning by the writing scanning unit 40.

The signal output unit 60 outputs a signal voltage (hereinafter, may be simply referred to as "signal voltage") $V_{sig}$ of the video signal according to the luminance information supplied from the signal supply source (not illustrated), or a reference voltage $V_{ofs}$ selectively. Here, the reference voltage $V_{ofs}$ is a voltage corresponding to a reference voltage of the signal voltage $V_{sig}$ of the video signal (for example, a voltage corresponding to the black level of the video signal), or a voltage near the reference voltage. The reference voltage $V_{ofs}$ is used as the initialization voltage when performing a correction operation.

The signal voltage $V_{sig}$/reference voltage $V_{ofs}$ selectively output from the signal output unit 60 is written to each of the pixels 20 of the pixel array portion 30 via the signal lines 33 ($33_1$ to $33_n$) in units of pixel rows selected by the line-sequential scanning performed by the writing scanning unit 40. That is, the signal output unit 60 adopts a drive manner of line-sequential writing in which the signal voltage $V_{sig}$ is written in units of pixel rows (lines).

[Pixel Circuit]

Figure 2:
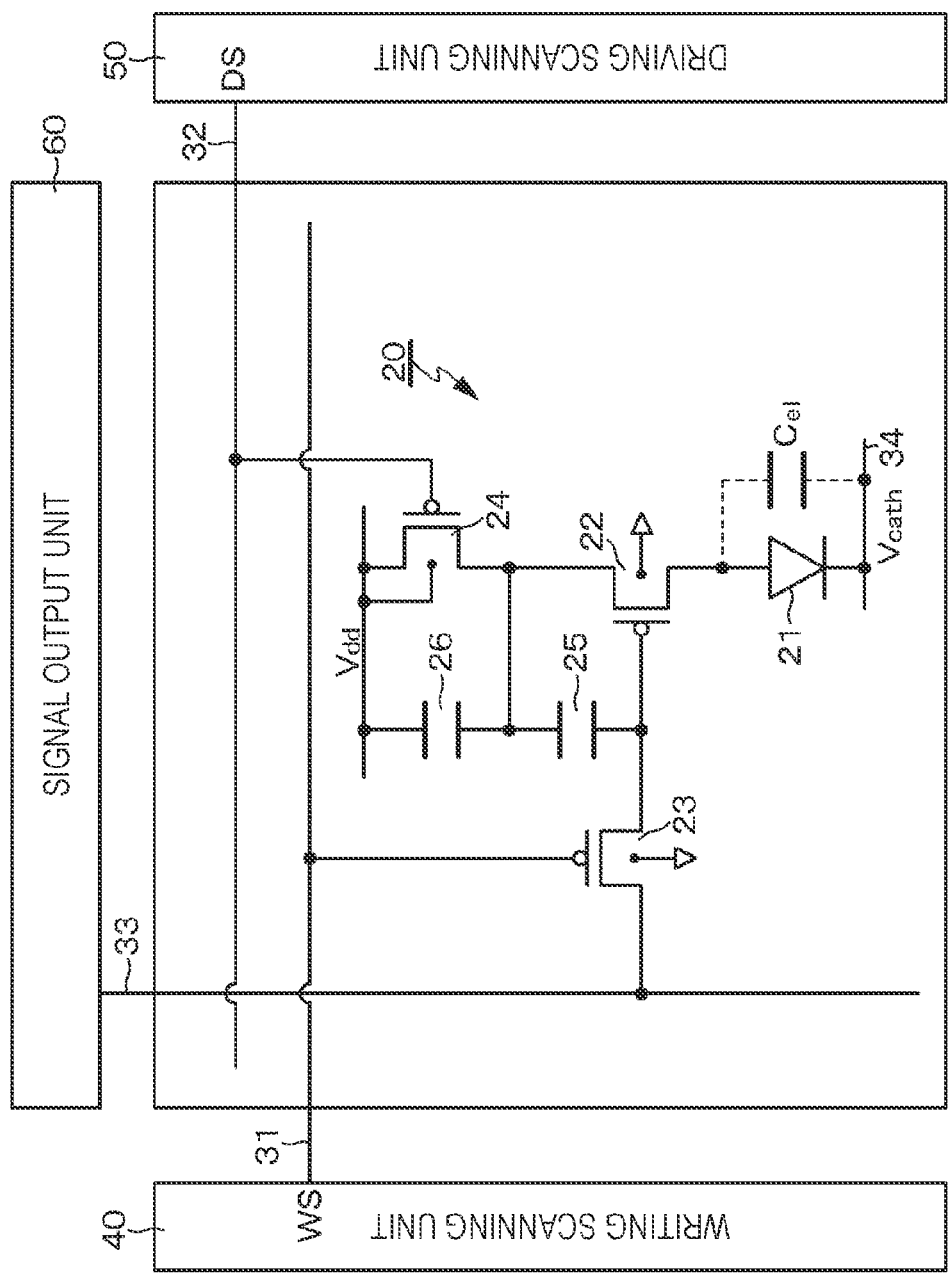
FIG. 2 is a circuit diagram illustrating a circuit configuration of a unit pixel (pixel circuit).

FIG. 2 is a circuit diagram illustrating an example of a circuit configuration of pixels (pixel circuits) in the active matrix organic EL display device 10. The light emitting portion of the pixel 20 includes an organic EL device 21. The organic EL device 21 is an exemplary current-driven electro-optical device having light emission brightness that changes in accordance with the value of the current flowing through the device.

As illustrated in FIG. 2, the pixel 20 includes the organic EL device 21 and a driving circuit (pixel driving circuit) that drives the organic EL device 21 by causing current to flow through the organic EL device 21. In the organic EL device 21, a cathode electrode is connected to a common power supply line 34 which is commonly wired to all the pixels 20. In the figure, $C_{el}$ is an equivalent capacitor of the organic EL device 21.

The driving circuit for driving the organic EL device 21 includes a drive transistor 22, a sampling transistor 23, a light emission control transistor 24, a retention capacitor 25, and an auxiliary capacitor 26. It is assumed here that the organic EL device 21 and its driving circuit are formed not on an insulator such as glass but on a semiconductor such as silicon, and a P-channel transistor is used as the drive transistor 22.

Furthermore, in this example, also as each of the sampling transistor 23 and the light emission control transistor 24, a P-channel transistor is used similarly to the drive transistor 22. Therefore, the drive transistor 22, the sampling transistor 23, and the light emission control transistor 24 each have four terminals of source/gate/drain/back gate instead of three terminals of source/gate/drain. A power supply voltage $V_{dd}$ is applied to the back gate.

However, the sampling transistor 23 and the light emission control transistor 24 are not limited to P-channel transistors because they are switching transistors that function as switch elements. Therefore, each of the sampling transistor 23 and the light emission control transistor 24 may be an N-channel transistor or a combination of P-channel and N-channel transistors.

In the pixel 20 having the above-described configuration, the sampling transistor 23 writes the signal voltage $V_{sig}$ of the video signal supplied from the signal output unit 60 to the retention capacitor 25 through the signal line 33 by sampling the signal voltage $V_{sig}$. The light emission control transistor 24 is connected between the node of the power supply voltage $V_{dd}$ and the source electrode of the drive transistor 22, and controls the light emission and non-light emission of the organic EL device 21 under the drive by the light emission control signal DS.

The retention capacitor 25 is connected between the gate electrode and the source electrode of the drive transistor 22. The retention capacitor 25 retains the signal voltage $V_{sig}$ of the video signal written by sampling by the sampling transistor 23. The drive transistor 22 drives the organic EL device 21 by causing a drive current corresponding to the retention voltage of the retention capacitor 25 to flow through the organic EL device 21.

The auxiliary capacitor 26 is connected between the source electrode of the drive transistor 22 and a node of a fixed potential, for example, a node of the power supply voltage $V_{dd}$. This auxiliary capacitor 26 has effects of suppressing fluctuations in the source potential of the drive transistor 22 when the signal voltage $V_{sig}$ of the video signal is written, and setting the gate-source voltage $V_{gs}$ of the drive transistor 22 to a threshold voltage $V_{th}$ of the drive transistor 22.

[Basic Panel Structure]

In the organic EL display device 10 having the above-described configuration, as the substrate of the display panel 70 on which the pixel array portion 30, its peripheral circuit, and the like are formed, an insulating transparent substrate such as a glass substrate may be used, or a semiconductor substrate such as a silicon substrate may be used.

An organic EL display device that uses a semiconductor substrate such as a silicon substrate as the substrate of the display panel 70 is referred to as a so-called microdisplay (small display), and is used preferably as an electronic view finder of a digital still camera, a display unit of a head mounted display, or the like.

Figure 3:
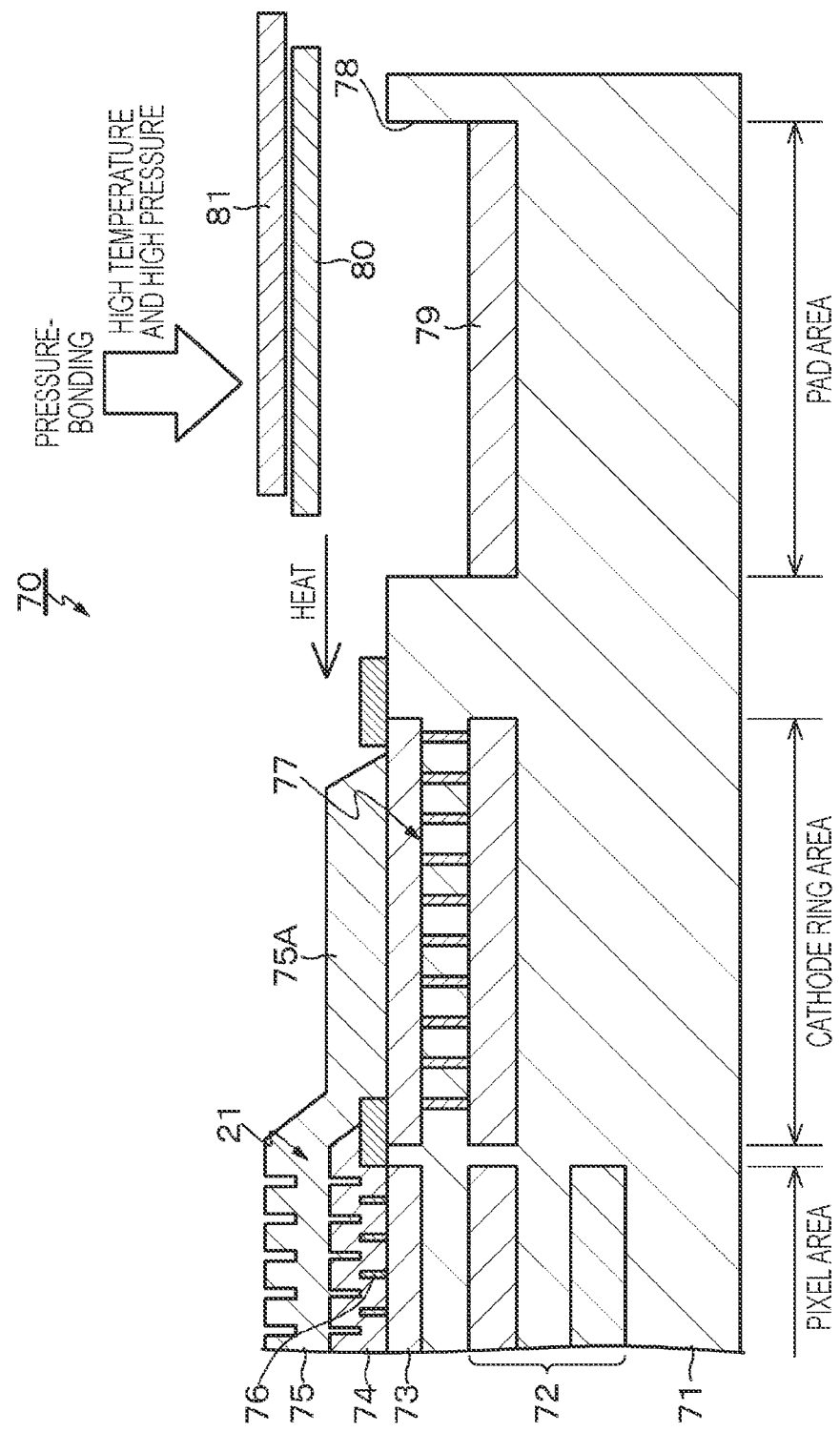
FIG. 3 is a cross-sectional view illustrating a basic panel structure of the outer peripheral portion of a pixel array portion in a display panel.

Hereinafter, the structure (panel structure) of the display panel 70 will be described by taking as an example a case where a semiconductor substrate such as a silicon substrate is used as the substrate of the display panel 70. FIG. 3 illustrates the basic panel structure of the outer peripheral portion of the pixel array portion 30 of the display panel 70.

Examples of the panel structure of the display panel 70 include a so-called top-emission type panel structure in which light is taken out from the side opposite to the support substrate on which the organic EL device 21 is formed, and a so-called bottom-emission type panel structure in which light is taken out from the support substrate side. The technology of the present disclosure can be applied to a panel structure of either a top-emission type panel structure or a bottom-emission type panel structure, but the case of the top-emission type is described below as an example.

Areas on a support substrate 71 made from a semiconductor substrate include an area of the pixel array portion 30 (pixel area) in which the plurality of pixels 20 is arranged in a matrix and the periphery area located on the peripheral area (outer edge side/outer peripheral side) of the pixel array portion 30. In the area of the pixel array portion 30, a circuit portion that includes the drive transistor 22, the sampling transistor 23, the light emission control transistor 24, the retention capacitor 25, and the auxiliary capacitor 26, and that drives the organic EL device 21 is provided. In the peripheral area, a peripheral circuit portion including the writing scanning unit 40, the driving scanning unit 50, the signal output unit 60, and the like are provided. Then, a circuit layer (not illustrated) including these circuit portions is formed on the support substrate 71.

The display panel 70 has a laminated structure in which, for example, a wiring layer 72, an anode electrode 73, an organic layer 74, and a cathode electrode 75 are laminated on the circuit layer. Although not illustrated here, a protective layer, a filler layer (adhesive layer), and a black matrix layer are laminated in this order on the cathode electrode 75. Note that a color filter is provided for each pixel in the same layer as the black matrix layer, and on the color filters, an opposing substrate is bonded, so that the opposing substrate seals the laminated structure.

Although not illustrated, the organic layer 74 has a structure in which a hole injection layer, a hole transport layer, a light emitting layer, an electron transport layer, and an electron injection layer are laminated in this order from the side of the anode electrode 73. Here, the hole injection layer is provided to increase the hole injection efficiency and prevent leakage. The hole transport layer is for increasing the hole transport efficiency to the light emitting layer. In the light emitting layer, when an electric field is applied, electrons and holes are recombined to generate light. The electron transport layer is for increasing the electron transport efficiency to the light emitting layer. The electron injection layer is for increasing the electron injection efficiency. Among these layers, layers other than the light emitting layer may be provided as needed.

The gap between the organic EL device 21 and the organic EL device 21 is defined by a pixel define layer (PDL) 76. Then, the anode electrode 73 is made from a metal material obtained by laminating aluminum, indium tin oxide (ITO), and silver, and is provided as a lower electrode (pixel electrode) of the organic EL device 21 for each pixel. The cathode electrode 75 is made from a light-transmitting material such as indium tin oxide, indium zinc oxide (IZO), and zinc oxide (ZnO), and is provided as an upper electrode (common electrode) of the organic EL device 21 commonly for all pixels. A cathode ring 77 for giving a cathode potential to the cathode electrode 75 is provided below an outermost peripheral portion 75A of the cathode electrode 75.

On the support substrate 71, a recess 78 is formed in the peripheral portion of the substrate outside the area of the cathode ring 77 (cathode ring area). Then, a pad electrode layer 79 made from an anisotropic conductive film (ACF) is formed in the recess 78. Flexible printed circuit (FPC) 81 are pressure-bonded to the pad electrode layer 79 in the recess 78 via an anisotropic conductive film (ACF) 80 under high temperature and high pressure conditions. In this pressure-bonding, in addition to temperature and pressure, time is also a parameter.

In the organic EL display device 10 having the above-described configuration, the organic EL device 21 is weak in heat resistance. Therefore, it is necessary to pay sufficient attention to heat in the manufacturing process of the organic EL display device 10. In particular, in a case where a semiconductor substrate is used as the support substrate 71 forming the organic EL device 21 and its driving circuit portion, the panel size is small. Therefore, in a mounting process that requires a high temperature after the EL process, specifically, in a process of pressure-bonding the flexible printed circuits 81 to the pad electrode layer 79 in the recess 78 of the support substrate 71 at a high temperature and high pressure, heat applied to the pad electrode layer 79 may propagate to the organic EL device 21 in the pixel area and deterioration of the organic EL device 21 due to the heat damage may deteriorate the display quality.

Embodiment of Present Disclosure

In the embodiment of the present disclosure, in order to reduce the heat damage to the organic EL device 21 and suppress the deterioration of the display quality due to the heat damage, the organic EL display device 10, which is provided with the pad electrode layer 79 outside the pixel array portion 30 on the support substrate 71, has a configuration in which the heat absorption layer 82 (see FIG. 4) is thermally coupled to the pad electrode layer 79. The heat absorption layer 82 has a function of increasing the heat capacity of the pad electrode layer 79.

By thermally coupling the heat absorption layer 82 to the pad electrode layer 79 in this way, the heat capacity of the pad electrode layer 79 can be increased, so that heat damage to the organic EL device 21 can be reduced when the flexible printed circuits 81 are pressure-bonded to the pad electrode layer 79 at high temperature and high pressure. Therefore, deterioration of display quality due to heat damage to the organic EL device 21 can be suppressed.

Hereinafter, the panel structure according to a specific example of the present embodiment in which the heat absorption layer 82 is thermally coupled to the pad electrode layer 79 to increase the heat capacity of the pad electrode layer 79 will be described.

First Example

Figure 4:
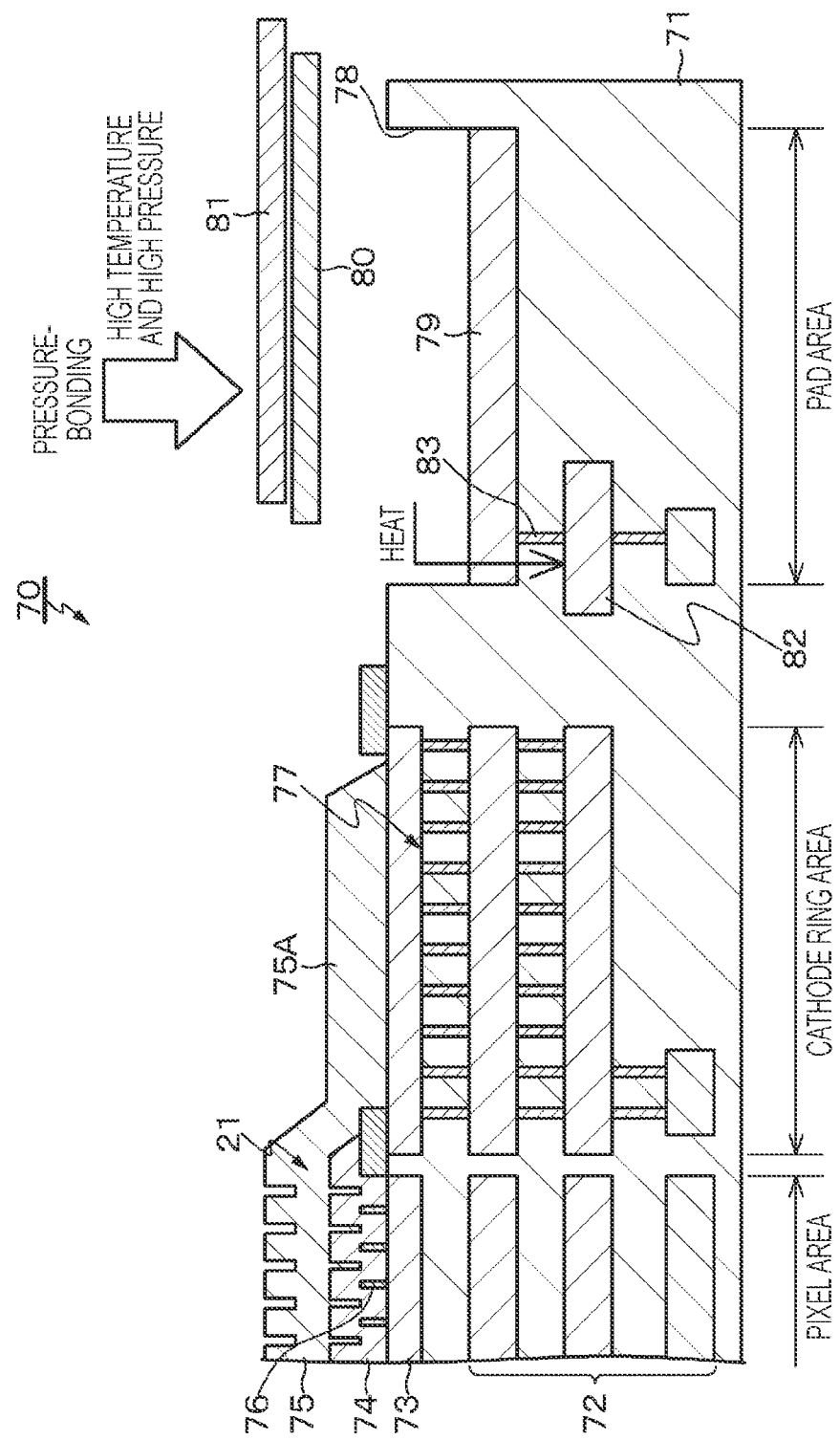
FIG. 4 is a cross-sectional view illustrating a panel structure of the outer peripheral portion of a pixel array portion in a display panel according to a first example.
Figure 5:
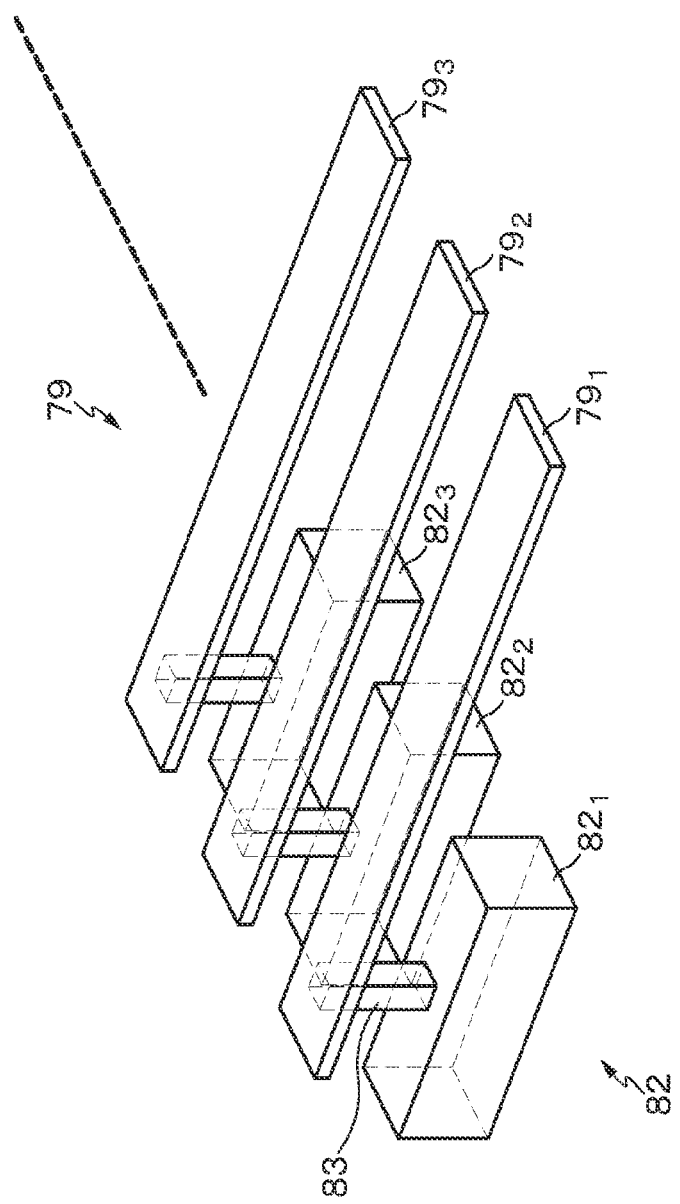
FIG. 5 is a schematic perspective view illustrating a pad electrode layer and a heat absorption layer in the panel structure according to the first example.

The first example is an example in which the heat absorption layer 82 is provided corresponding to a part, in the length direction, of each pad of the pad electrode layer 79. FIG. 4 illustrates a schematic cross-sectional view of the panel structure of the outer peripheral portion of the pixel array portion 30 in the display panel 70 according to the first example, and FIG. 5 illustrates a schematic perspective view of the pad electrode layer 79 and the heat absorption layer 82 in the panel structure according to the first example.

In the organic EL display device 10 having the panel structure according to the first example, the pad electrode layer 79 is provided outside the pixel array portion 30 on the support substrate 71. In the pad electrode layer 79, a plurality of pads $79_1$, $79_2$, $79_3$, ... is arranged, for example, at a constant pitch in the recess 78 of the support substrate 71.

The panel structure according to the first example includes the heat absorption layer 82 as a layer below the pad electrode layer 79. Then, the heat absorption layer 82 is thermally coupled to the pad electrode layer 79 by thermal coupling portions 83. As illustrated in FIG. 5, the heat absorption layer 82 includes heat absorption portions $82_1$, $82_2$, $82_3$, ... that are provided corresponding to the plurality of pads $79_1$, $79_2$, $79_3$, ..., and that are independent of each other.

The plurality of heat absorption portions $82_1$, $82_2$, $82_3$, ... is provided corresponding to parts, in the length direction, of the individual pads $79_1$, $79_2$, $79_3$, ... of the pad electrode layer 79 in a state of being electrically separated from each other. Then, the plurality of heat absorption portions $82_1$, $82_2$, $82_3$, ... is thermally coupled to the pads $79_1$, $79_2$, $79_3$, ..., respectively via the thermal coupling portions 83 to increase the heat capacities of the pads $79_1$, $79_2$, $79_3$, ....

In general, heat capacity depends on the type and mass of the substance. Therefore, by increasing the mass of each of the heat absorption portions $82_1$, $82_2$, $82_3$, ... of the heat absorption layer 82, the heat capacity of each of the pads $79_1$, $79_2$, $79_3$, ... of the pad electrode layer 79 can be increased. In the panel structure according to the first example, the heat absorption layer 82 is made from, for example, the same material as the material of the anode electrode 73 of the organic EL device 21 such as aluminum, and is formed as a wiring layer in the same layer as one of the multiple wiring layers 72 in the pixel area. In other words, in the panel structure according to the first example, the wiring layer formed as the same layer as the heat absorption layer 82 below the pixel array portion 30 (in this example, the wiring layer that is the center one of the three wiring layers 72) is provided.

According to the panel structure according to the first example described above, in the step of pressure-bonding the flexible printed circuits 81 to the pad electrode layer 79 at high temperature and high pressure, each of the heat absorption portions $82_1$, $82_2$, $82_3$, ... of the heat absorption layer 82 thermally bonded to the corresponding one of the pads $79_1$, $79_2$, $79_3$, ... of the pad electrode layer 79 can absorb heat. Therefore, the heat damage to the organic EL device 21 can be reduced, and thus deterioration of display quality due to heat damage to the organic EL device 21 can be suppressed.

Furthermore, in the panel structure according to the first example, the wiring layer formed as the same layer as the heat absorption layer 82 below the pixel array portion 30 (in this example, the wiring layer that is the center one of the three wiring layers 72) is provided, and the wiring layer can be used as a reinforcement of the cathode ring 77. This effect is provided similarly by a second example as described later.

Second Example

Figure 6:
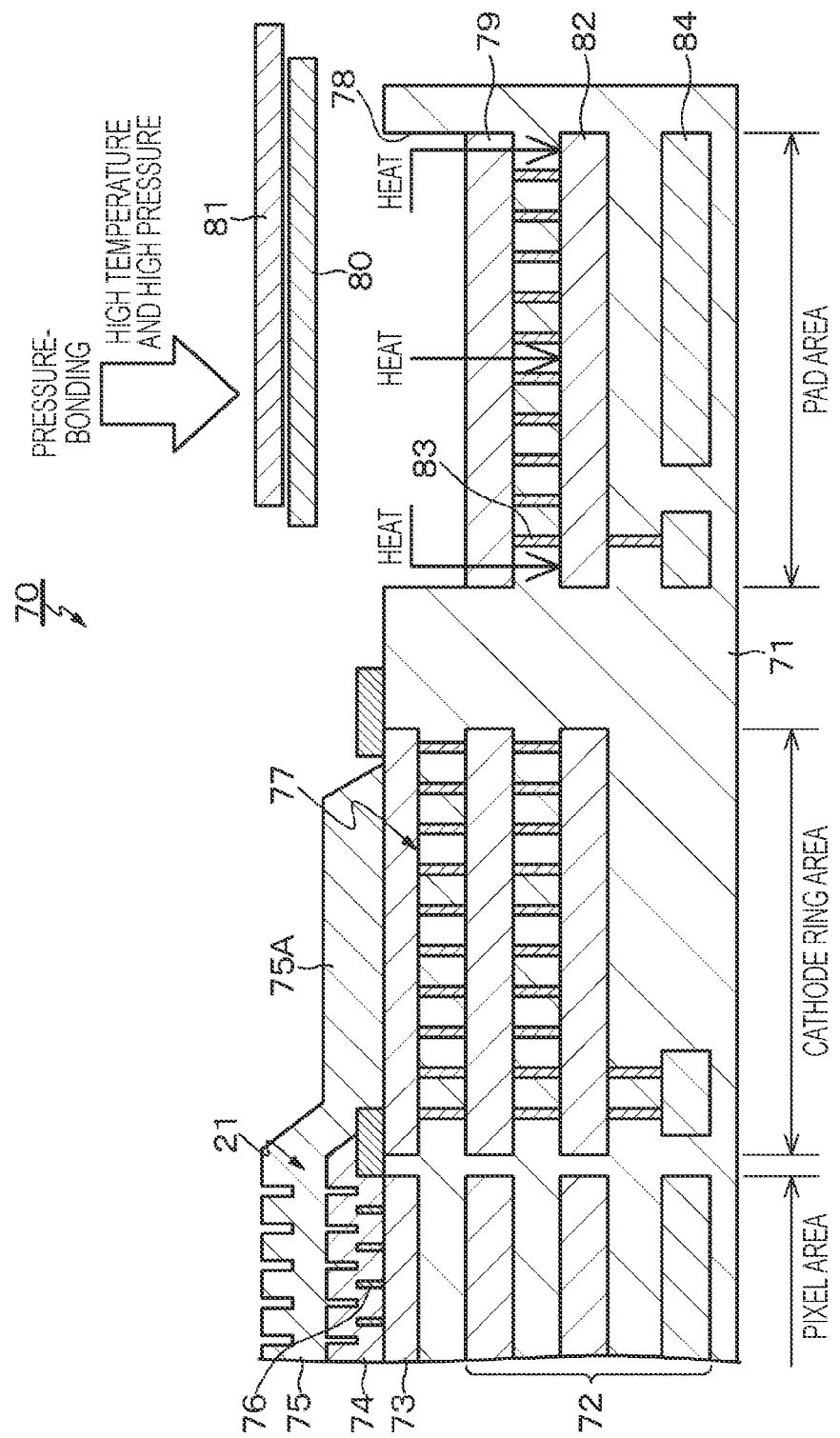
FIG. 6 is a cross-sectional view illustrating a panel structure of the outer peripheral portion of a pixel array portion in a display panel according to a second example.
Figure 7:
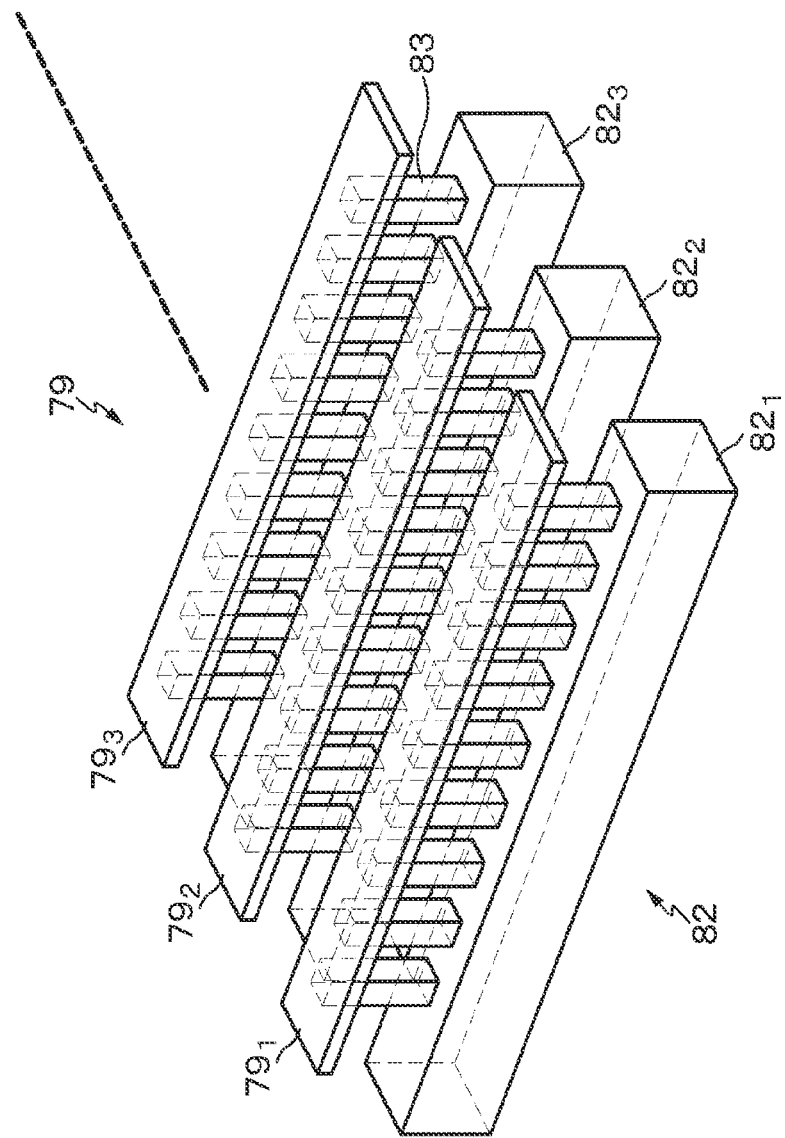
FIG. 7 is a schematic perspective view illustrating a pad electrode layer and a heat absorption layer in the panel structure according to the second example.

The second example is an example in which the heat absorption layer 82 is provided over the whole, in the length direction, of each pad of the pad electrode layer 79. FIG. 6 illustrates a schematic cross-sectional view of the panel structure of the outer peripheral portion of the pixel array portion 30 in the display panel 70 according to the second example, and FIG. 7 illustrates a schematic perspective view of the pad electrode layer 79 and the heat absorption layer 82 in the panel structure according to the second example.

In the panel structure according to the second example, the plurality of heat absorption portions $82_1$, $82_2$, $82_3$, ... of the heat absorption layer 82 is provided over the whole, in the length direction, of the individual pads $79_1$, $79_2$, $79_3$, ... of the pad electrode layer 79, and the heat absorption portions $82_1$, $82_2$, $82_3$ are thermally coupled to the pads $79_1$, $79_2$, $79_3$, ... by a plurality of the thermal coupling portions 83 for the respective pads.

In the panel structure according to the second example, each of the heat absorption portions $82_1$, $82_2$, $82_3$, ... of the heat absorption layer 82 is made from, for example, the same material as the material of the anode electrode 73 of the organic EL device 21 such as aluminum, and is formed as a wiring layer in the same layer as one of the multiple wiring layers 72 in the pixel area similarly to the panel structure according to the first example. Furthermore, below the pad electrode layer 79 and below the heat absorption layer 82, for example, a circuit wiring layer 84 is formed as the same layer as the lowest wiring layer among the three wiring layers 72 in the pixel area.

In the panel structure according to the second example described above, each of the heat absorption portions $82_1$, $82_2$, $82_3$, ... of the heat absorption layer 82 is provided over the whole, in the length direction, of the corresponding one of the pads $79_1$, $79_2$, $79_3$, ... of the pad electrode layer 79. Therefore, according to the panel structure according to the second example, the heat absorption effect in the pressure-bonding process at high temperature and high pressure is larger than a case of the panel structure according to first example, in which the heat absorption portions $82_1$, $82_2$, $82_3$, ... are provided corresponding to parts in the length direction. As a result, the heat damage to the organic EL device 21 can be reduced more securely, and thus deterioration of display quality due to the heat damage can be suppressed more securely.

Furthermore, according to the panel structure according to the second example, each of the heat absorption portions $82_1$, $82_2$, $82_3$, ... of the heat absorption layer 82 is provided over the whole, in the length direction, of the corresponding one of the pads $79_1$, $79_2$, $79_3$, ... of the pad electrode layer 79. Therefore, it is possible to improve the mechanical strength of the pad electrode layer 79 with respect to the lower side in pressure-bonding at high temperature and high pressure. Therefore, it is possible to arrange the circuit wiring layer 84 and another wiring layer below it, and a circuit element such as a transistor can be arranged below the pad electrode layer 79, which would have low mechanical strength without the heat absorption layer 82.

Modification Examples

Although the technology of the present disclosure has been described above on the basis of the preferred embodiment, the technology of the present disclosure is not limited to the embodiment. The configuration and structure of the display device described in the above-described embodiment are examples, and can be changed as appropriate. For example, in the above-described embodiment, the technology of the present disclosure has been described by taking an organic EL device (display panel) as an example, but the technology of the present disclosure can be applied to a display device other than organic EL devices, specifically, all display devices having a panel structure in which pad electrode layers are provided outside the pixel array portion.

Furthermore, in the above-described embodiment, a display device in which a semiconductor substrate such as a silicon substrate is used as a substrate of the display panel has been described as an example, but application of the technology of the present disclosure is not limited to the example and the technology of the present disclosure can be applied to a display device in which an insulating transparent substrate such as a glass substrate is used.

<Electronic Device of Present Disclosure>

The display device of the present disclosure described above can be used as a display unit (display device) of an electronic device in all fields that displays a video signal input to the electronic device or a video signal generated in the electronic device as an image or a video. Examples of the electronic device include a television set, a notebook personal computer, a digital still camera, a mobile terminal device such as a mobile phone, and a head mounted display. However, the electronic device is not limited to these examples.

According to the technology of the present disclosure, in the pressure-bonding process at high temperature and high pressure, it is possible to reduce the heat damage to the light emitting portion (light emitting element) and suppress the deterioration of the display quality due to the heat damage, and thus it is possible to provide a display image of high quality. Then, by using the display device of the present disclosure as a display unit (display device) of an electronic device in all fields, it is possible to provide a display image of high quality.

Hereinafter, a smartphone, a head mounted display, and a digital still camera will be described as specific examples of an electronic device using the display device of the present disclosure. However, the specific examples described here are only examples, and the electronic device is not limited to these examples.

First Specific Example: Example of Smartphone

Figure 8A:
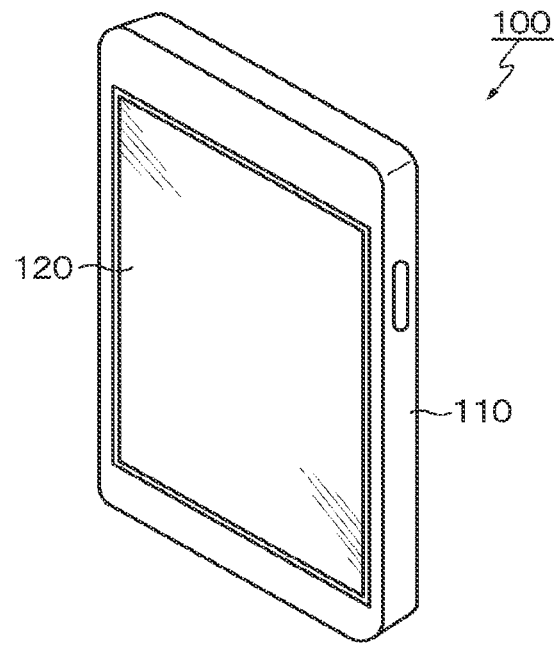
FIG. 8A is an external view of a smartphone according to a first specific example of the electronic device of the present disclosure as seen from the front side.
Figure 8B:
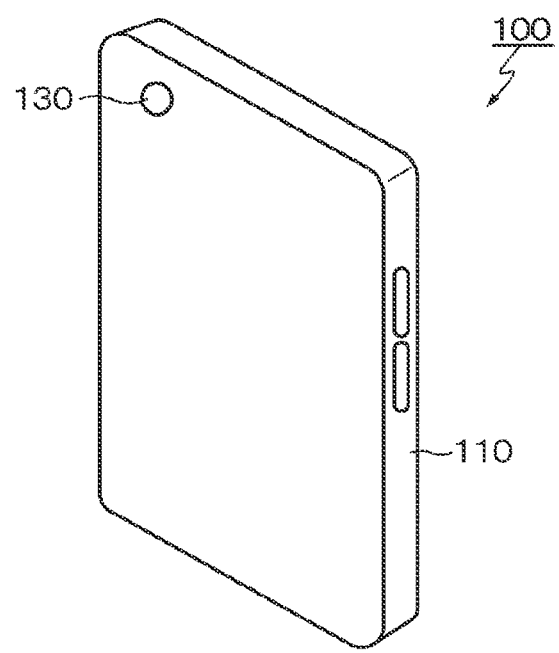
FIG. 8B is an external view as seen from the back side.

FIG. 8A illustrates an external view of a smartphone according to a first specific example of the electronic device of the present disclosure as seen from the front side, and FIG. 8B illustrates an external view as seen from the back side. The smartphone 100 according to this specific example includes a display unit 120 on the front side of a housing 110. Furthermore, the smartphone 100 includes, for example, an imaging unit 130 at an upper part of the back side of the housing 110.

In the smartphone 100, which is an example of the mobile device having the above-described configuration, the display device of the present disclosure can be used as the display unit 110. That is, the smartphone 100 according to the first specific example is manufactured by using the display device of the present disclosure as the display unit 120 thereof.

Second Specific Example: Example of Head Mounted Display

Figure 9:
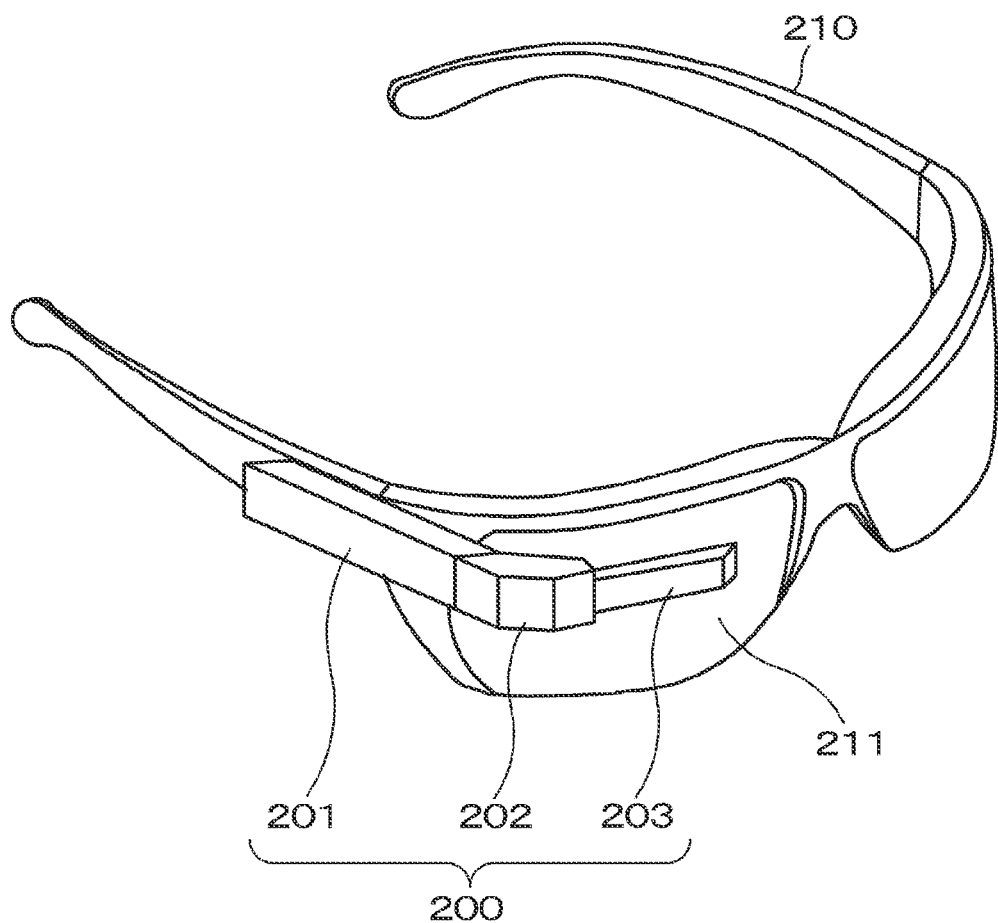
FIG. 9 is an external view illustrating a head mounted display according to a second specific example of the electronic device of the present disclosure.

FIG. 9 illustrates an external view of a head mounted display according to a second specific example of the electronic device of the present disclosure.

The head mounted display 200 according to the second specific example has a see-through head mounted display configuration including a main body portion 201, an arm portion 202, and a lens barrel 203. The main body portion 201 is connected to the arm portion 202 and glasses 210. Specifically, an end portion of the main body portion 201 in the long side direction is attached to the arm portion 202. Furthermore, one of the side faces of the main body portion 201 is coupled to the glasses 210 via a connecting member (not illustrated). Note that the main body portion 201 may be directly attached to the head of a human body.

The main body portion 201 contains a control board for controlling the operation of the head mounted display 200 and a display unit. The arm portion 202 supports the lens barrel 203 with respect to the main body portion 201 by coupling the main body portion 201 and the lens barrel 203. Specifically, the arm portion 202 is coupled to the end portion of the main body portion 201 and the end portion of the lens barrel 203 to fix the lens barrel 203 with respect to the main body portion 201. Furthermore, the arm portion 202 contains a signal line for communicating data related to an image provided from the main body portion 201 to the lens barrel 203.

The lens barrel 203 projects image light provided from the main body portion 201 via the arm portion 202 to the eyes of a user wearing the head mounted display 200 through a lens 211 of the glasses 210. In this head mounted display 200, the display device of the present disclosure can be used as a display unit contained in the main body portion 201. That is, the head mounted display 200 according to the second specific example is manufactured by using the display device of the present disclosure as the display unit thereof.

Third Specific Example: Example of Digital Still Camera

Figure 10A:
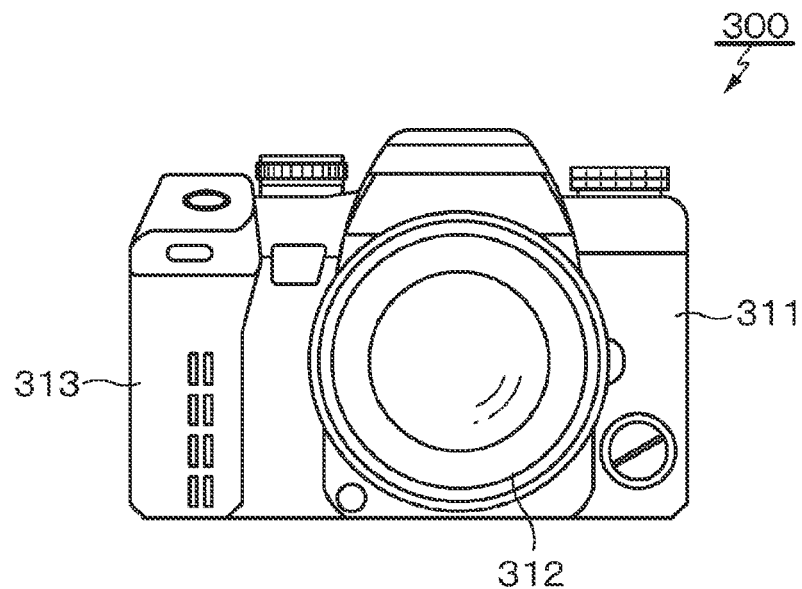
FIG. 10A is a front view of a digital still camera according to a third specific example of the electronic device of the present disclosure.
Figure 10B:
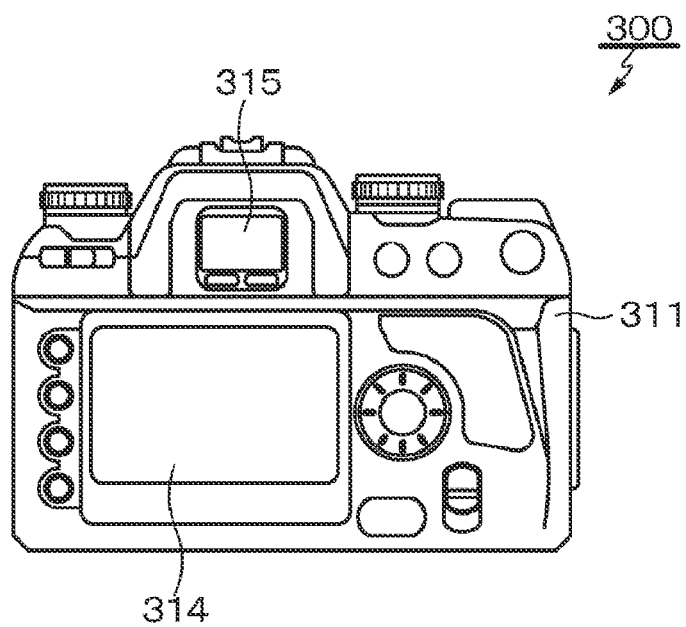
FIG. 10B is a rear view of the digital still camera.

FIG. 10 illustrates an external view of a lens-interchangeable single-lens reflex digital still camera according to a third specific example of the electronic device of the present disclosure. FIG. 10A is a front view of the digital still camera, and FIG. 10B is a rear view of the digital still camera.

A lens-interchangeable single-lens reflex digital still camera 300 includes, for example, an interchangeable imaging lens unit (interchangeable lens) 312 on the front right side of the camera main body portion (camera body) 311, and a grip portion 313 for a photographer to hold the digital still camera 300 on the front left side. Then, a monitor 314 is provided in the center of the back face of the camera main body portion 311. A view finder (eyepiece window) 315 is provided above the monitor 314. By looking in the view finder 315, a photographer can determine the composition while visually recognizing an optical image of a subject guided by the imaging lens unit 312.

In the lens-interchangeable single-lens reflex digital still camera 300 having the above-described configuration, the display device of the present disclosure can be used as the view finder 315 thereof. That is, the lens-interchangeable single-lens reflex digital still camera 300 according to the third specific example is manufactured by using the display device of the present disclosure as the view finder 315 thereof.

<Possible Configuration of Present Disclosure>

Note that the present disclosure may also have the following configurations.

<<A. Display Device>>

[A-1] A display device including:
  a pixel array portion in which pixels each including a light emitting portion are arranged;
  a pad electrode layer provided outside the pixel array portion on a substrate on which a light emitting portion is formed; and
  a heat absorption layer thermally coupled to the pad electrode layer.

[A-2] The display device according to [A-1] described above, in which
  the heat absorption layer has a function of increasing a heat capacity of the pad electrode layer.

[A-3] The display device according to [A-2] described above, in which
  the heat absorption layer includes a wiring layer formed as a layer below the pad electrode layer.

[A-4] The display device according to [A-3] described above, in which
  the heat absorption layer is provided over a whole, in a length direction, of each of pads of the pad electrode layer.

[A-5] The display device according to [A-4] described above, in which
  a circuit wiring layer is provided below the heat absorption layer.

[A-6] The display device according to [A-3] or [A-4] described above, in which
  a wiring layer formed as a same layer as the heat absorption layer is provided below the pixel array portion.

[A-7] The display device according to any one of [A-1] to [A-6] described above, in which
  the light emitting portion includes an organic electroluminescence device.

[A-8] The display device according to [A-7] described above, in which
  the heat absorption layer is made from a same material as a material of an anode electrode of the organic electroluminescence device.

[A-9] The display device according to any one of [A-1] to [A-8] described above, in which
  the circuit portion that drives the light emitting portion is formed on a semiconductor substrate.

<<B. Electronic Device>>

[B-1] An electronic device including a display device that includes:
  a pixel array portion in which pixels each including a light emitting portion are arranged;
  a pad electrode layer provided outside the pixel array portion on a substrate on which a light emitting portion is formed; and
  a heat absorption layer thermally coupled to the pad electrode layer.

[B-2] The electronic device according to [B-1] described above, in which
  the heat absorption layer has a function of increasing a heat capacity of the pad electrode layer.

[B-3] The electronic device according to [B-2] described above, in which
  the heat absorption layer includes a wiring layer formed as a layer below the pad electrode layer.

[B-4] The electronic device according to [B-3] described above, in which
  the heat absorption layer is provided over a whole, in a length direction, of each of pads of the pad electrode layer.

[B-5] The electronic device according to [B-4] described above, in which
  a circuit wiring layer is provided below the heat absorption layer.

[B-6] The electronic device according to [B-3] or [B-4] described above, in which
  a wiring layer formed as a same layer as the heat absorption layer is provided below the pixel array portion.

[B-7] The electronic device according to any one of [B-1] to [B-6] described above, in which
  the light emitting portion includes an organic electroluminescence device.

[B-8] The electronic device according to [B-7] described above, in which
  the heat absorption layer is made from a same material as a material of an anode electrode of the organic electroluminescence device.

[B-9] The electronic device according to any one of [B-1] to [B-8] described above, in which
  the circuit portion that drives the light emitting portion is formed on a semiconductor substrate.

REFERENCE SIGNS LIST

10 Organic EL display device
20 Pixel
21 Organic EL device
22 Drive transistor
23 Sampling transistor
24 Light emission control transistor
Retention capacitor
26 Auxiliary capacitor
Pixel array portion
$31_1$ to $31_m$ Scanning line
$32_1$ to $32_m$ Drive line
$33_1$ to $33_n$ Signal line
40 Writing scanning unit
50 Driving scanning unit
60 Signal output unit
70 Display panel
71 Support substrate (semiconductor substrate)
72 Wiring layer
73 Anode electrode
74 Organic layer
75 Cathode electrode
76 Pixel define layer (PDL)
77 Cathode ring
78 Recess
79 Pad electrode layer
80 Anisotropic conductive film (ACF)
81 Flexible printed circuits (FPC)
82 Heat absorption layer
83 Thermal coupling portion
84 Circuit wiring layer

The invention claimed is:

1. A display device comprising:
   a pixel array portion in which pixels each including a light emitting portion are arranged in rows and columns in a plan view;
   a pad electrode layer on which another light emitting portion is formed, the pad electrode layer being arranged on a substrate outside the pixel array portion in the plan view; and
   a heat absorption layer thermally coupled to the pad electrode layer, wherein
   the heat absorption layer is configured to increase a heat capacity of the pad electrode layer,
   the heat absorption layer includes a wiring layer formed as a layer below the pad electrode layer, and
   the heat absorption layer is provided over an entirety of each of pads of the pad electrode layer in a length direction.

2. The display device according to claim 1, wherein a circuit wiring layer is provided below the heat absorption layer.

3. An electronic device comprising a display device that includes:
   a pixel array portion in which pixels each including a light emitting portion are arranged in rows and columns in a plan view;
   a pad electrode layer on which another light emitting portion is formed, the pad electrode layer being arranged on a substrate outside the pixel array portion in the plan view; and
   a heat absorption layer thermally coupled to the pad electrode layer, wherein
   the heat absorption layer is configured to increase a heat capacity of the pad electrode layer,
   the heat absorption layer includes a wiring layer formed as a layer below the pad electrode layer, and
   the heat absorption layer is provided over an entirety of each of pads of the pad electrode layer in a length direction.

4. The electronic device according to claim 3, wherein a circuit wiring layer is provided below the heat absorption layer.

* * * * *